(12) United States Patent
Kuo et al.

(10) Patent No.: US 7,137,037 B2
(45) Date of Patent: Nov. 14, 2006

(54) DATA STORAGE SYSTEM AND METHOD FOR TESTING THE SAME

(75) Inventors: Lung Yi Kuo, Taichung (TW); Yu-Ling How, Kaohsiung (TW)

(73) Assignee: Silicon Motion, Inc., Hsin Chui (TW)

( * ) Notice: Subject to any disclaimer, the term of this patent is extended or adjusted under 35 U.S.C. 154(b) by 658 days.

(21) Appl. No.: 10/397,299

(22) Filed: Mar. 27, 2003

(65) Prior Publication Data

US 2004/0194062 A1    Sep. 30, 2004

(51) Int. Cl.
  *G06F 11/00* (2006.01)
(52) U.S. Cl. ......................................... 714/42; 714/30
(58) Field of Classification Search ..................... None
  See application file for complete search history.

(56) References Cited

U.S. PATENT DOCUMENTS

| | | | | |
|---|---|---|---|---|
| 5,138,619 A | * | 8/1992 | Fasang et al. | 714/718 |
| 5,525,971 A | * | 6/1996 | Flynn | 714/724 |
| 5,574,855 A | * | 11/1996 | Rosich et al. | 714/41 |
| 5,615,335 A | * | 3/1997 | Onffroy et al. | 714/30 |
| 5,661,729 A | * | 8/1997 | Miyazaki et al. | 714/719 |
| 6,122,762 A | * | 9/2000 | Kim | 714/726 |
| 6,243,842 B1 | * | 6/2001 | Slezak et al. | 714/724 |
| 6,643,725 B1 | * | 11/2003 | Kozakai et al. | 710/300 |
| 6,658,611 B1 | * | 12/2003 | Jun | 714/719 |
| 6,687,857 B1 | * | 2/2004 | Iwata et al. | 714/38 |
| 6,865,702 B1 | * | 3/2005 | Roohparvar | 714/718 |

\* cited by examiner

*Primary Examiner*—Scott Baderman
*Assistant Examiner*—Gabriel L. Chu
(74) *Attorney, Agent, or Firm*—Rosenberg, Klein & Lee (57) ABSTRACT

A method for testing a data storage system. The data storage system contains a buffer area, firmware and a storage area. The method including: selecting at least one product testing item, commanding the firmware to execute a starting process in order to transfer the storage system from general working mode to testing mode, commanding the firmware to execute a testing process corresponding to the selected product testing item, the executed testing process generates a testing result, displaying the result; and commanding the firmware to execute an ending process in order to return the storage to general working mode. Users use an application program to give commands to the firmware after requesting disc access service from the computer operation system. The buffer area can be a RAM (Random Access Memory). The testing result can be displayed on a computer monitor.

3 Claims, 9 Drawing Sheets

DATA STORAGE SYSTEM AND METHOD FOR TESTING THE SAME

TECHNICAL FIELD

This invention relates generally to a method for testing a data storage system, in particular, to provide a method for testing a data storage system such as a flash memory device, a memory card and the access device thereof.

BACKGROUND OF THE INVENTION

A data storage system contains a data storage device and the access device thereof. Traditional data storage devices include hard discs, floppy discs, and memory cards. As capacity and utility of the flash memory and other non-volatile memory are improved and the prices thereof are reasonable, portable data storage devices containing flash memories are popular such as Compact Flash memory card (CF card), Smart Media Flash card (SM card), portable flash memory driver adaptable to computer USB port. The access devices include all kinds of readers for the data storage device such as CF card reader.

After the data storage devices and the access devices are manufactured. They have to be tested in order to control the quality of the products. The test includes writing parameters to the data storage devices, reading the parameters of the data storage devices, self-test, code setting, updating firmware, testing memory devices such as flash, low level formatting storage elements, reading storage elements statuses and so on.

A conventional method of testing the data storage system includes writing a new driver or modifying a standard driver, so test personnel can operate an application program under a computer operating system to test the products through a test platform such as a card reader or other access devices. The access devices can be an integrated hard disc integrating both the functions of a card reader and a data storage device. However writing a new driver or modifying a standard driver burdens the cost of research and development. Besides modifying standard driver sometimes will cause computer system unstable. In addition, when the computer operating system is upgraded or the interfaces of the test platforms are no longer supported by the computer, the test will be interrupted. Therefore a method for testing a data storage system that can reduce the cost of test and will not be interrupted by system upgrading is needed.

SUMMARY OF INVENTION

It is therefore a primary objective of the present invention to provide a method of testing a data storage system without writing a new driver or modifying a standard driver.

Another object of the invention is to provide a method of testing a data storage system that will not be interrupted because of computer system upgrading.

The present invention, briefly summarized, in one embodiment discloses a method for testing a data storage system. The data storage system contains a buffer area, firmware and a storage area. The method includes: selecting at least one product testing item, commanding the firmware to execute a starting process in order to transfer the data storage system from general working mode to testing mode, commanding the firmware to execute a testing process corresponding to the selected product testing item, the executed testing process generating a testing result, displaying the result; and commanding the firmware to execute an ending process in order to return the data storage system to general working mode. Users use an application program to give commands to the firmware after requesting disc access service from the computer operation system. The buffer area can be a RAM (Random Access Memory). The testing result can be displayed on a computer monitor.

BRIEF DESCRIPTION OF DRAWINGS

The invention will be more clearly understood after refer to the following detailed description read in conjunction with the drawings wherein.

DETAILED DESCRIPTION OF PREFERRED EMBODIMENTS

Figure 1:
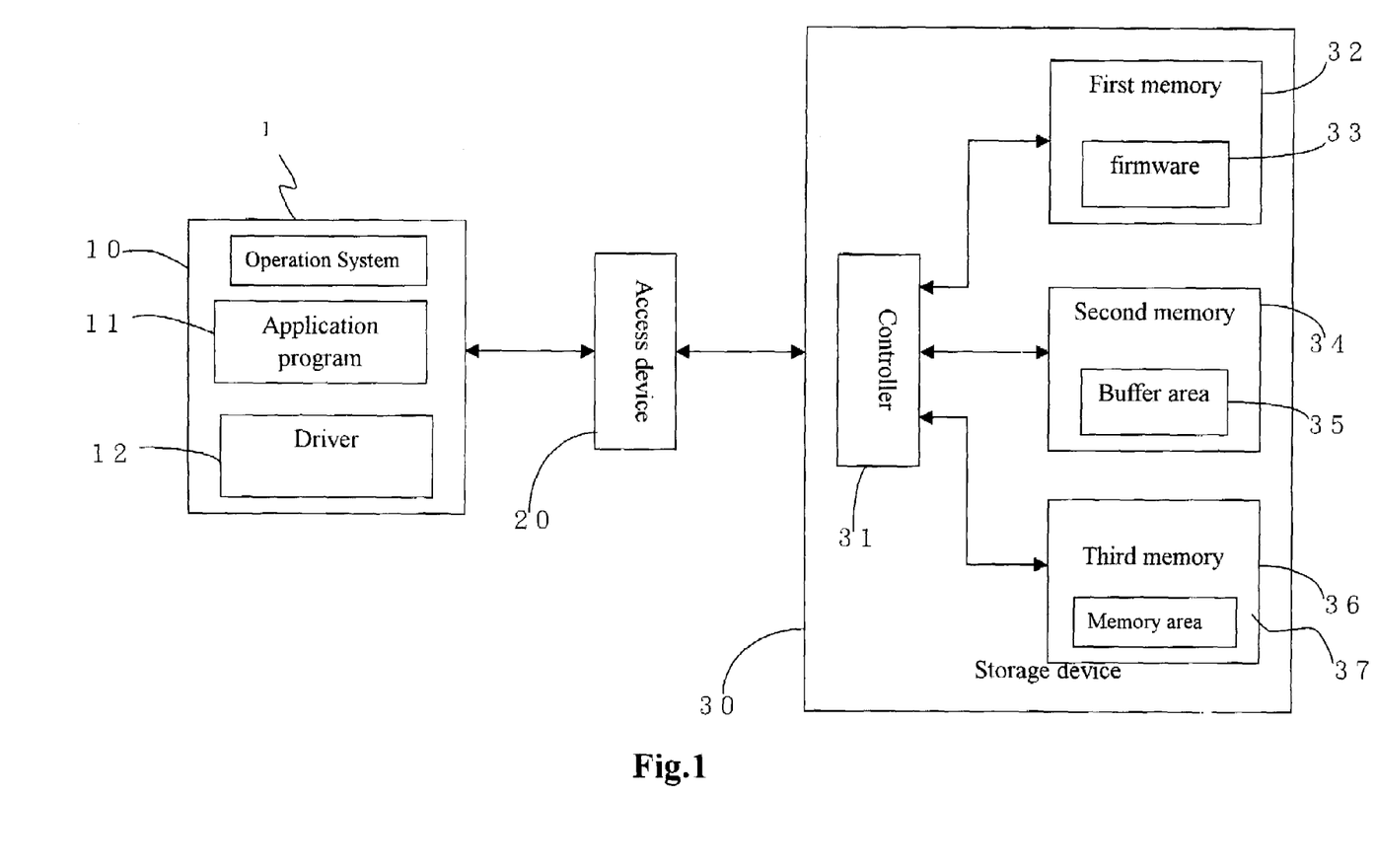
FIG. 1 is a functional block diagram of an embodiment of the present invention.

FIG. 1 illustrates a functional block diagram of the present invention. The embodiment mainly describes using an application program 11 in a computer 10 through an access device 20 to test the access device 20 as well as the data storage device 30. The data storage device 30 contains a controller 31, a first memory 32, a second memory 34 and a third memory 36. The first memory contains firmware 33. The second memory 34 contains a buffer area 35. The third memory contains a memory area 37 for saving other data. The computer 1 contains an operation system 10 (O.S.), the application program 11 for giving commands to the firmware 33 in order the firmware 33 can execute processes and a driver 12 for driving the data storage device 30. The data storage device 30 can be a Compact Flash memory card (CF card). The access device 20 can be a Compact Flash card reader. The first memory can be a read only memory (ROM). The second memory 34 can be a non-volatile memory such as a SDRAM. The third memory 36 can be a flash memory. The first and second memories 32, 34 can individually or together integrate with the controller 31 as an integrated programmable control chip. To test a flash memory driver, the flash memory driver can be plugged into a USB port of the computer 1.

Since the Operation system 10 of the computer 1 can provide disc access service, the application program 11 can drive the access device 20 through the operation system 10 and give commands and save any data acceptable by the data storage device 30 to the data storage device 30. Therefore, users can write commands into the buffer area 35 and execute the commands to transfer the data storage device 30 from general working mode to testing mode. After the data storage device 30 enters testing mode, users can similarly write testing commands to the buffer area 35 and give commands to the firmware 33 to execute the commands to test the data storage device 30 or the access device 20. After all the testing jobs have been done, the user can use the application program 11 give an ending command to the data storage device 30 in order to return the data storage device to general working mode.

Figure 2:
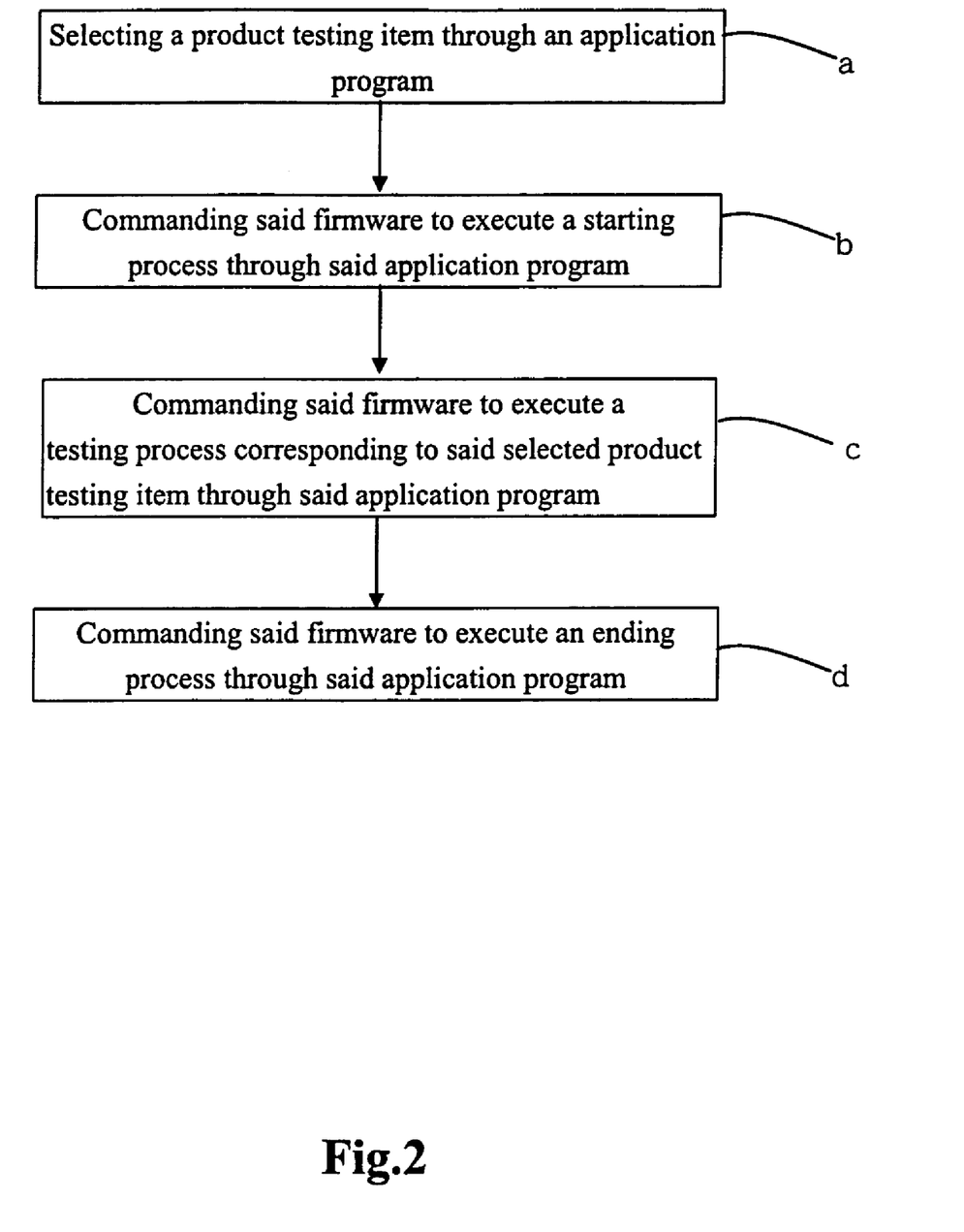
FIG. 2 is a flowchart showing a process of an embodiment.

With Reference to FIG. 1 and FIG. 2, FIG. 2 illustrates a flowchart of a process of an embodiment. The process contains: (a) selecting at least one product testing item through the application program 11; (b) commanding the firmware to execute a starting process through the application program 11 in order to transfer the storage system from general working mode to testing mode; (c) commanding the firmware 33 to execute a testing process corresponding to the selected product testing item through the application program 11, the executed testing process generating a testing result; and (d) commanding the firmware 33 to execute an ending process through the application program 11 in order to return the data storage system to general working mode. The testing result can be displayed on a monitor. For example when the data storage system contains a CF card and a CF card reader, the testing result can display the results showing whether the products have met the standards.

An SM card doesn't contain the devices such as a controller, firmware or a buffer area as in a CF card. However these devices can be installed in an SM card reader. The process is still the same. Accordingly, the SM card and the SM card reader can be similarly tested. A flash memory driver also doesn't contain the devices such as a controller, firmware or a buffer area as in a CF card. User can use the devices in the computer 1, so the flash memory card can also be tested in the same way. The only differences are the locations of the devices being different.

Figure 3:
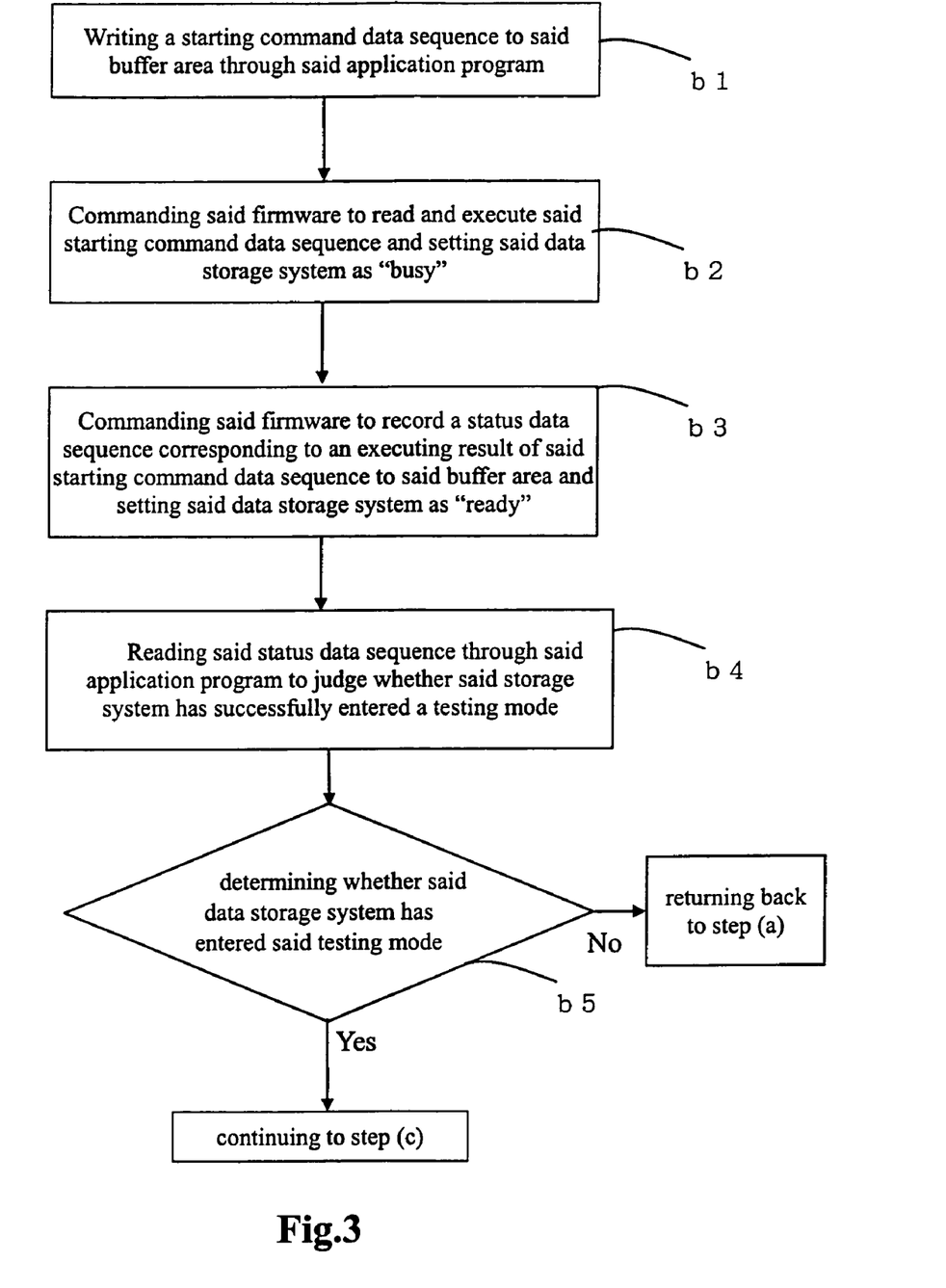
FIG. 3 is a flowchart showing a process of step (b) of the embodiment.

With reference to FIG. 3, the process (b) in FIG. 2 contains the steps: (b1) writing a starting command data sequence to the buffer area 35 through the application program 11; (b2) commanding the firmware 33 to read and execute the starting command data sequence and setting the data storage system status as "busy"; (b3) commanding the firmware 33 to record a status data sequence corresponding to an executing result of the starting command data sequence to the buffer area 35 and setting the data storage system status as "ready"; (b4) reading the status data sequence through the application program 11 to judge whether the data storage system has successfully entered the testing mode; and (b5) determining whether the data storage system has entered the testing mode, if so, continuing to step (c), and if not, returning back to step (a).

Figure 4:
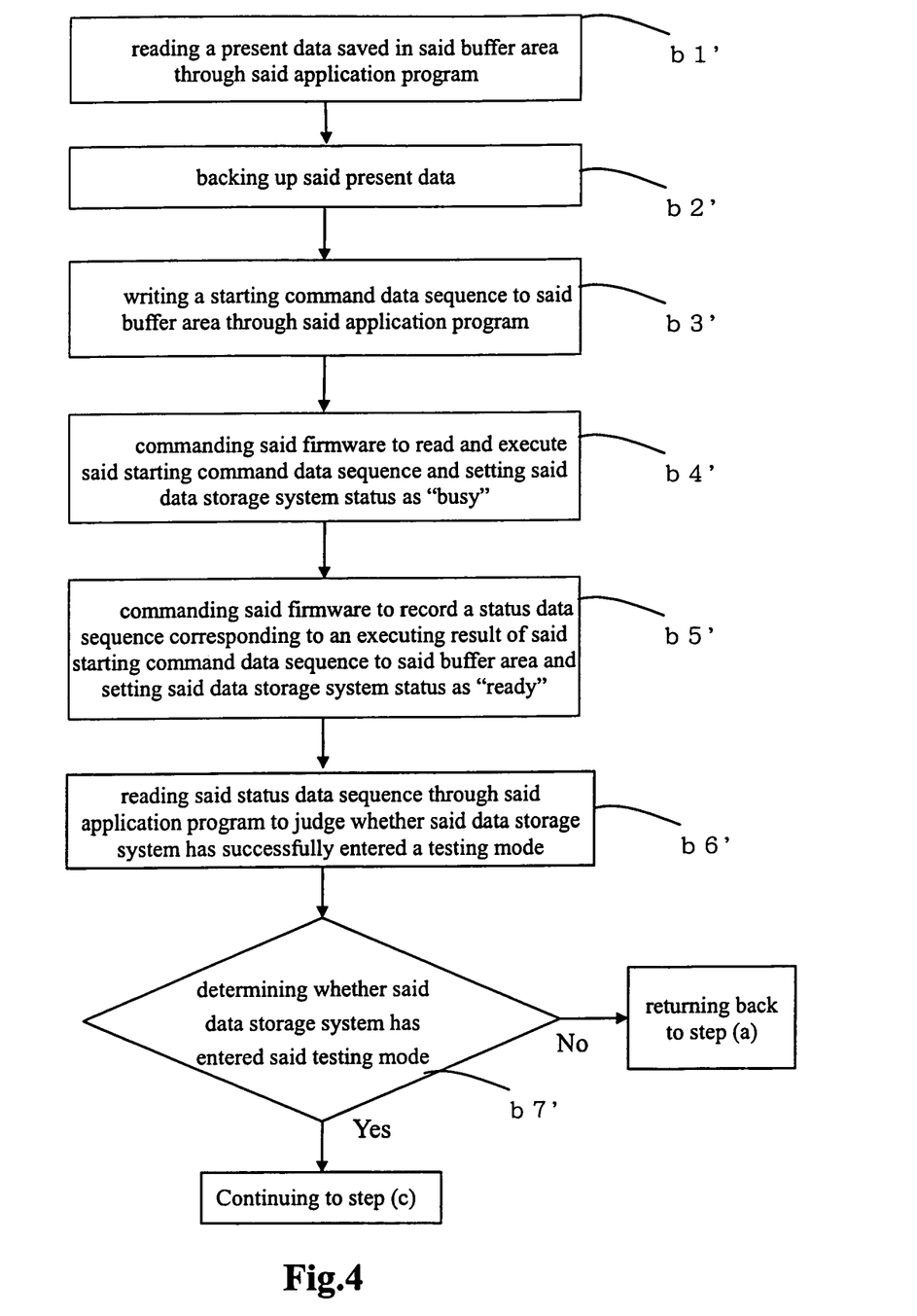
FIG. 4 is a flowchart showing another process of step (b) of the embodiment.

When considering there maybe some important data saved in the buffer area 35 before and in case the important data may be lost, it's better to backup the data and after the test copy the data back to the buffer area 35. Therefore, with reference to FIG. 4, the alternative step (b') contains: (b1') reading a present data saved in the buffer area 35 through the application program 11; (b2') backing up the present data; (b3') writing a starting command data sequence to the buffer area through the application program 11; (b4') commanding the firmware 33 to read and execute the starting command data sequence and setting the data storage system status as "busy"; (b5') commanding the firmware 33 to record a status data sequence corresponding to an executing result of the starting command data sequence to the buffer area 35 and setting the data storage system status as "ready"; (b6') reading the status data sequence through the application program 11 to judge whether the data storage system has successfully entered the testing mode; and (b7') determining whether the data storage system has entered the testing mode, if so, continuing to step (c), and if not, returning back to step (a).

Figure 5:
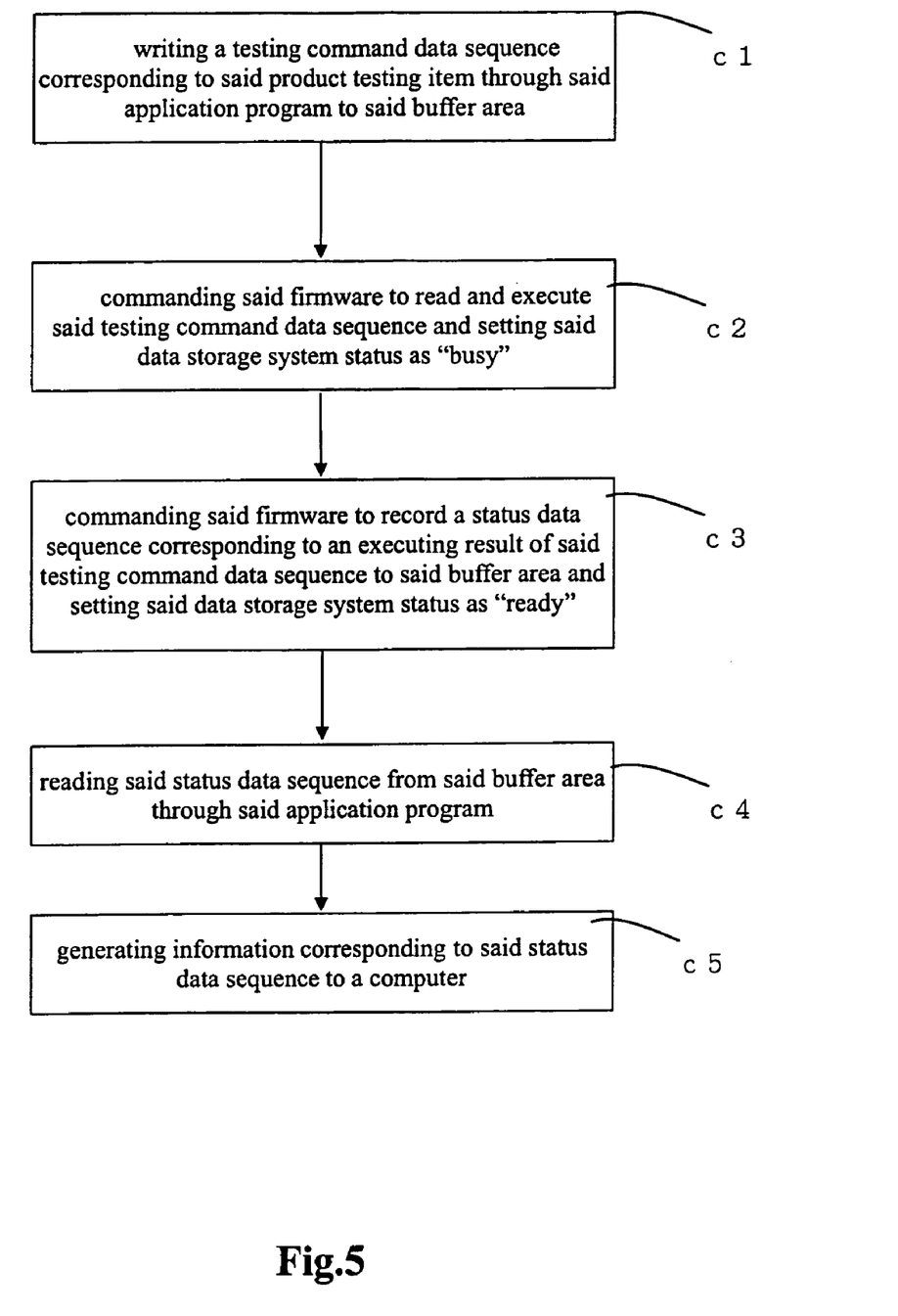
FIG. 5 is a flowchart showing a process of step (c) of the embodiment.
Figure 6:
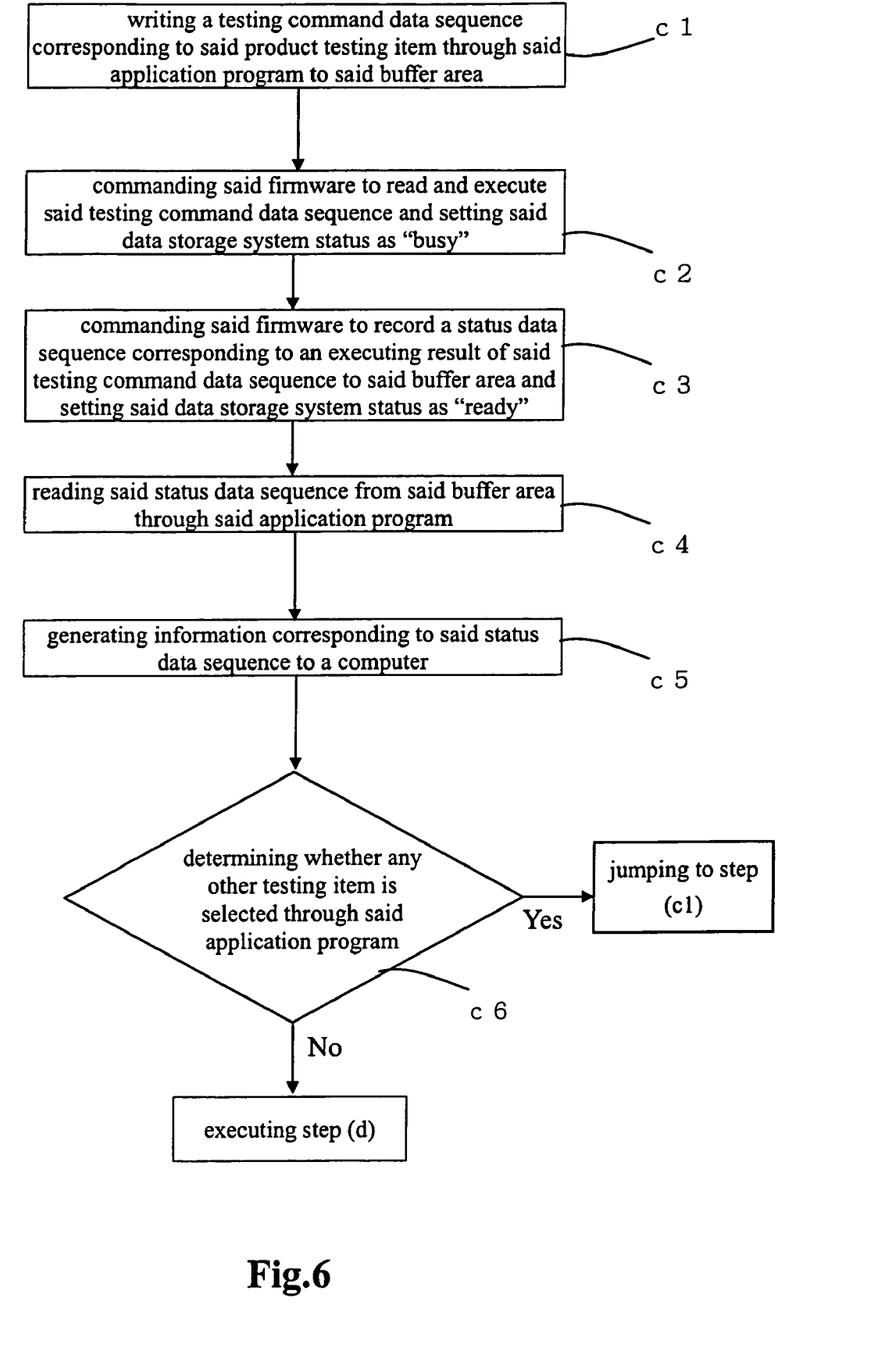
FIG. 6 is a flowchart showing another process of step (c) of the embodiment.

After the data storage system has entered the testing mode and the status of the data storage system is "ready", the step (c) is proceeded. With reference to FIG. 5, the step (c) contains: (c1) writing a testing command data sequence corresponding to the product testing item through the application program to the buffer area; (c2) commanding the firmware to read and execute the testing command data sequence and setting the data storage system status as "busy"; (c3) commanding the firmware to record a status data sequence corresponding to an executing result of the testing command data sequence to the buffer area and setting the data storage system status as "ready"; (c4) reading the status data sequence from the buffer area through the application program; and (c5) generating information corresponding to the status data sequence to a computer. Thereafter, the status data can be displayed on the monitor, so users can know the testing results.

The testing command data sequence contains: commands regarding writing the references of access device 20, commands regarding reading references and status of access device 20, self testing commands, firmware updating commands, buffer area testing commands and other commands for verifying the quality of the data storage system.

If the testing item is more than one, another step (c6) can be added to the process in FIG. 5. The step c6 is: (c6) determining whether any other testing item is selected through the application program 11, if so, jump to step (c1), if not, executing step (d).

Figure 7:
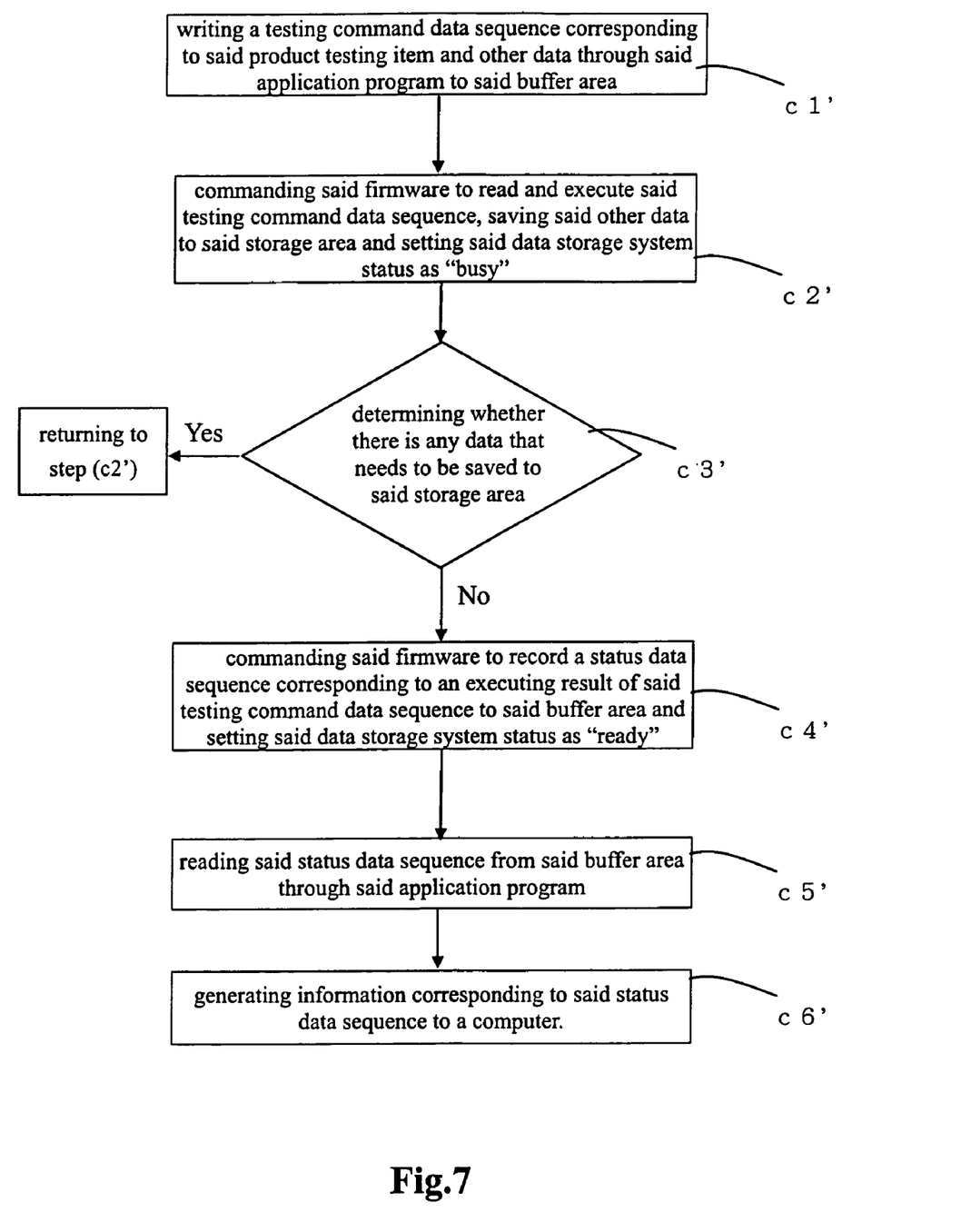
FIG. 7 is a flowchart showing a further process of step (c) of the embodiment.

Regarding step (a) in FIG. 2, if the selected item includes writing a large amount of data to the data storage system such as edition, form and serial number and the volume exceed 256 bytes, the process (c) is preferably adapt the process in FIG. 7: (c1') writing a testing command data sequence corresponding to the product testing item and other data through the application program to the buffer area; (c2') commanding the firmware to read and execute the testing command data sequence, saving the other data to the storage area and setting the data storage system status as "busy"; (c3') determining whether there is any data that needs to be saved to the storage area, if so, returning to step (2'), if not, executing step (4'); (c4') commanding the firmware to record a status data sequence corresponding to an executing result of the testing command data sequence to the buffer area and setting the data storage system status as "ready"; (c5') reading the status data sequence from the buffer area through the application program; and (c6') generating information corresponding to the status data sequence to a computer.

Figure 8:
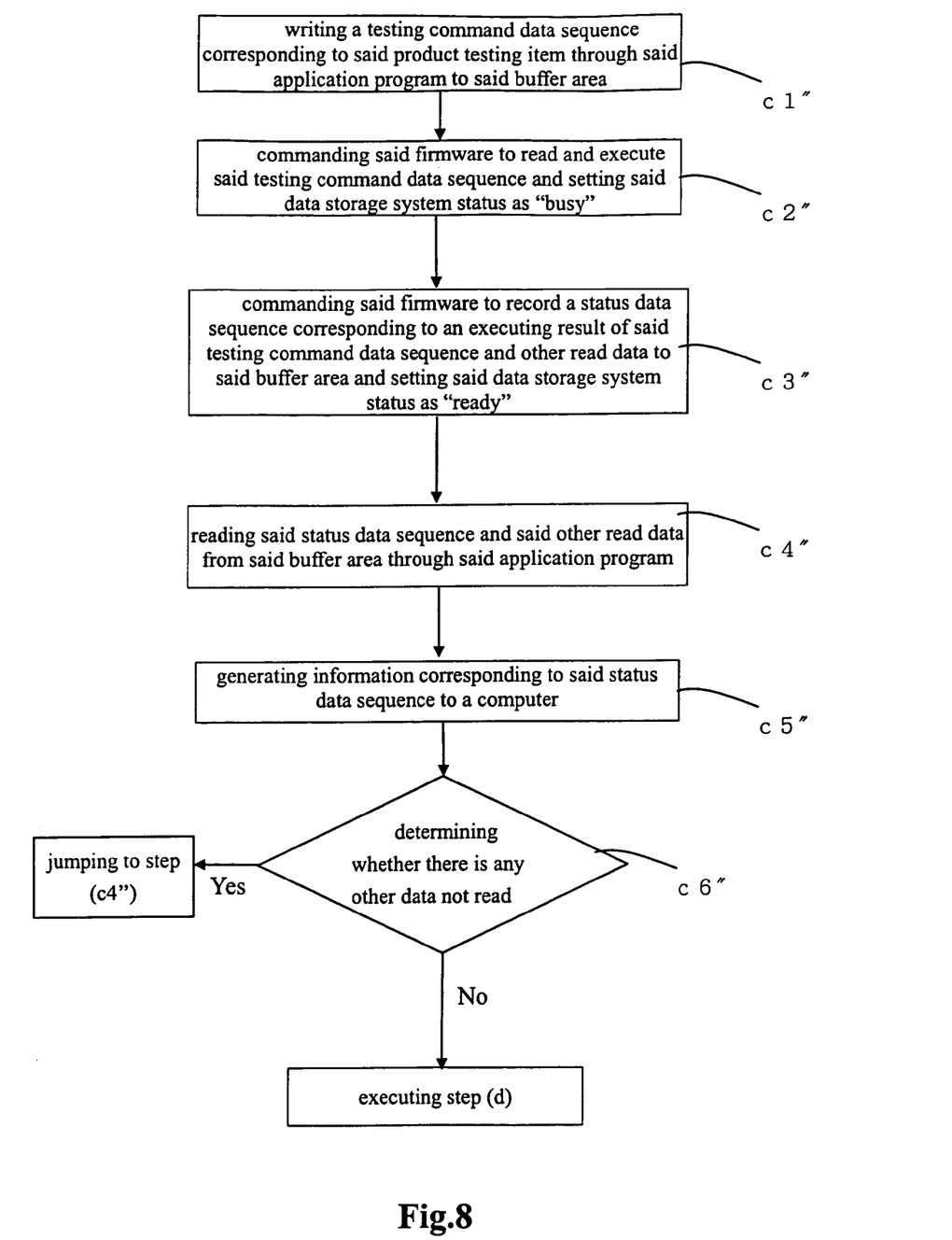
FIG. 8 is a flowchart showing still a further process of step (c) of the embodiment.

Regarding step (a) in FIG. 2, if the selected item includes: reading a large amount of data from the data storage system such as reading a card information structure (CIS) and the CIS volume exceeds 256 bytes, the process (c) is preferably adapt the process in FIG. 8: (c1") writing a testing command data sequence corresponding to the product testing item through the application program to the buffer area; (c2") commanding the firmware to read and execute the testing command data sequence and setting the data storage system status as "busy"; (c3") commanding the firmware to record a status data sequence corresponding to an executing result of the testing command data sequence and other read data to the buffer area and setting the data storage system status as "ready"; (c4") reading the status data sequence and the other read data from the buffer area through the application program; (c5") generating information corresponding to the status data sequence to a computer; and (c6") determining whether there is any other data not read, if so jump to step (c4"), if not executing step (d).

Figure 9:
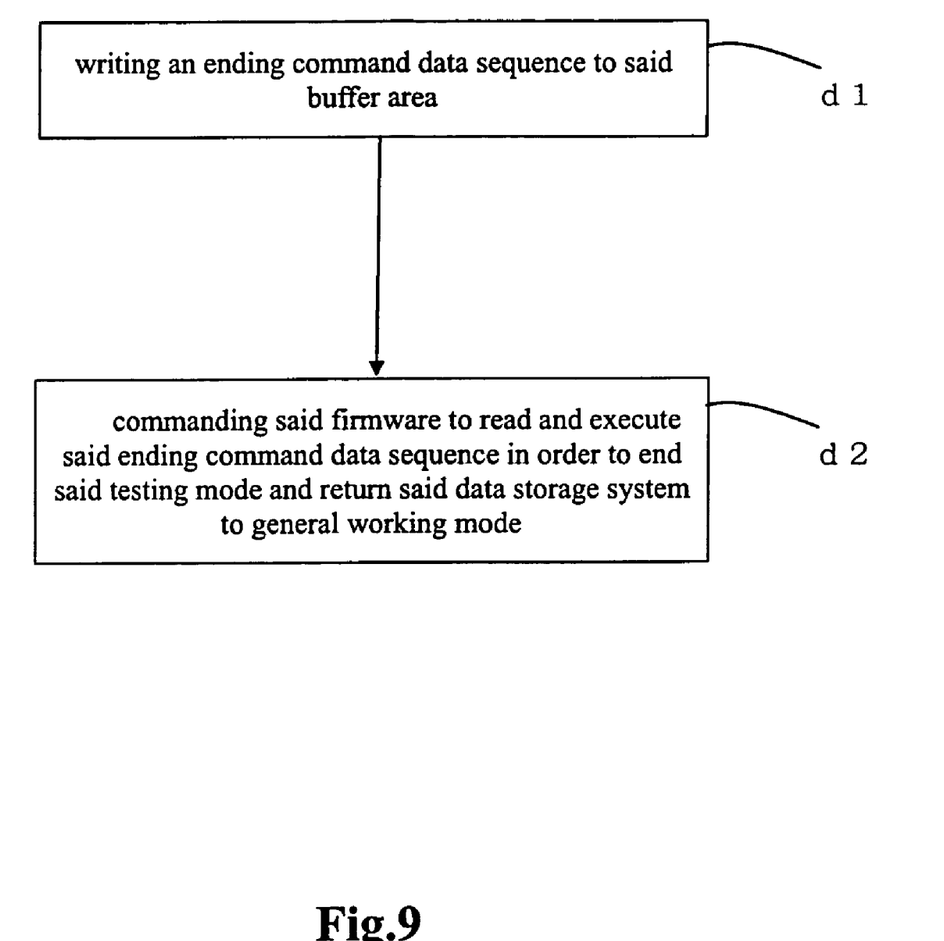
FIG. 9 is a flowchart showing a process of step (d) of the embodiment.

When all the testing items have been executed, then move forward to step (d). With reference to FIG. 9, the step (d) contains: (d1) writing an ending command data sequence to the buffer area; and (d2) commanding the firmware to read and execute the ending command data sequence in order to end the testing mode and return the data storage system to general working mode.

One of the advantages is because the process of reading and writing data in or out of the data storage system are managed by the driver, the present invention can ignore how the computer access different type of data storage systems. Therefore all kinds of data storage device can be tested as long as the data storage device can communicate with the computer. For example the present invention can test both the memory cards with ISA and USB interface. Another advantage of the present invention is that the application program provides a user friendly interface for user to read or write data in or out of the data storage device such as updating BIOS, changing product name, change manufacture's name, password setting and so on)

Numerous characteristics and advantages of the invention have been set forth in the foregoing description, together with details of the structure and function of the invention, and the novel features thereof are pointed out in appended claims. The disclosure, however, is illustrated only, and changes may be made in detail, especially, in matters of shape, size and arrangement of parts, materials and the combination thereof within the principle of the invention, to the full extend indicated by the broad general meaning of the terms in which the appended claims are expressed.

We claim:

1. A method for testing a data storage system, said data storage system comprising a buffer area, firmware and a storage area, said method comprising:
   (a) selecting at least one product testing item through an application program;
   (b) commanding said firmware to execute a starting process through said application program in order to transfer said data storage system from general working mode to testing mode, wherein said process (b) comprises:
      (b1) writing a starting command data sequence to said buffer area through said application program;
      (b2) commanding said firmware to read and execute said starting command data sequence and setting said data storage system status as "busy";
      (b3) commanding said firmware to record a status data sequence corresponding to an executing result of said starting command data sequence to said buffer area and setting said data storage system status as "ready";
      (b4) reading said status data sequence through said application program to judge whether said data storage system has successfully entered said testing mode; and
      (b5) determining whether said data storage system has entered said testing mode, if so, continuing to step (c), and if not, returning back to step (a);
   (c) commanding said firmware to execute a testing process corresponding to said selected product testing item through said application program, said executed testing process generating a testing result; and
   (d) commanding said firmware to execute an ending process through said application program in order to return said data storage system to general working mode.

2. A method for testing a data storage system, said data storage system comprising a buffer area, firmware and a storage area, said method comprising:
   (a) selecting at least one product testing item through an application program;
   (b) commanding said firmware to execute a starting process through said application program in order to transfer said data storage system from general working mode to testing mode, wherein said process (b) comprises:
      (b1') reading a present data saved in said buffer area through said application program;
      (b2') backing up said present data;
      (b3') writing a starting command data sequence to said buffer area through said application program;
      (b4') commanding said firmware to read and execute said starting command data sequence and setting said data storage system status as "busy";
      (b5') commanding said firmware to record a status data sequence corresponding to an executing result of said starting command data sequence to said buffer area and setting said data storage system status as "ready";
      (b6') reading said status data sequence through said application program to judge whether said storage system has successfully entered said testing mode; and
      (b7') determining whether said data storage system has entered said testing mode, if so, continuing to step (c), and if not, returning back to step (a);
   (c) commanding said firmware to execute a testing process corresponding to said selected product testing item through said application program, said executed testing process generating a testing result; and
   (d) commanding said firmware to execute an ending process through said application program in order to return said data storage system to general working mode.

3. A method for testing a data storage system, said data storage system comprising a buffer area, firmware and a storage area, said method comprising:
   (a) selecting at least one product testing item through an application program;
   (b) commanding said firmware to execute a starting process through said application program in order to transfer said data storage system from general working mode to testing mode;
   (c) commanding said firmware to execute a testing process corresponding to said selected product testing item through said application program, said executed testing process generating a testing result, wherein said process (c) comprises:
      (c1") writing a testing command data sequence corresponding to said product testing item through said application program to said buffer area;
      (c2")commanding said firmware to read and execute said testing command data sequence and setting said data storage system status as "busy";
      (c3") commanding said firmware to record a status data sequence corresponding to an executing result of said testing command data sequence and other read data to said buffer area and setting said storage system status as "ready";

(c4") reading said status data sequence and said other read data from said buffer area through said application program;
(c5") generating information corresponding to said status data sequence to a computer; and
(c6") determining whether there is any other data not read, if so jump to step (c4"), if not executing step (d); and (d) commanding said firmware to execute an ending process through said application program in order to return said data storage system to general working mode.

* * * * *